(12) United States Patent
Miyashita

(10) Patent No.: US 7,817,077 B2
(45) Date of Patent: Oct. 19, 2010

(54) DIFFERENTIAL COMPARATOR, AND PIPELINE TYPE A/D CONVERTER EQUIPPED WITH THE SAME

(75) Inventor: Hiroyuki Miyashita, Ashikaga (JP)

(73) Assignees: Sanyo Electronic Co., Ltd, Moriguchi-shi (JP); Sanyo Semiconductor Co., Ltd, Gunma (JP)

( * ) Notice: Subject to any disclaimer, the term of this patent is extended or adjusted under 35 U.S.C. 154(b) by 29 days.

(21) Appl. No.: 12/404,835

(22) Filed: Mar. 16, 2009

(65) Prior Publication Data

US 2009/0243906 A1    Oct. 1, 2009

(30) Foreign Application Priority Data

Mar. 14, 2008    (JP)    ................. 2008-066296

(51) Int. Cl.
*H03M 1/38*    (2006.01)
(52) U.S. Cl. .................. 341/161; 341/155; 341/162; 327/52; 327/57; 327/97
(58) Field of Classification Search ......... 341/161–162; 327/57, 97
See application file for complete search history.

(56) References Cited

U.S. PATENT DOCUMENTS 6,369,743 B2 *    4/2002    Ono ........................... 341/159
6,617,992 B2 *    9/2003    Sakurai ....................... 341/161
6,778,126 B2 *    8/2004    Ali ............................. 341/156

FOREIGN PATENT DOCUMENTS

JP    05-014199    1/1993
JP    2004-236143    8/2004

\* cited by examiner

*Primary Examiner*—Khai M Nguyen
(74) *Attorney, Agent, or Firm*—Westerman, Hattori, Daniels & Adrian, LLP

(57) ABSTRACT

In some examples, a differential comparator includes a differential amplifier configured to output differential output signals, a first switch portion configured to input the differential output signals from the differential amplifier and output the differential output signals from output terminals while alternatively changing over the output terminals, a latch portion configured to update and latch the differential output signals from the output terminals of the first switch portion, and a second switch portion configured to input output signals from the latch portion and output the latched output signals. The first switch portion and the second switch portion are changed over complementarily so that the differential output signals from the differential amplifier are always outputted from the same first and second output terminals of the second switch portion respectively.

9 Claims, 6 Drawing Sheets

DIFFERENTIAL COMPARATOR, AND PIPELINE TYPE A/D CONVERTER EQUIPPED WITH THE SAME

This application claims priority under 35 U.S.C. §119 to Japanese Patent Application No. 2008-66296 filed on Mar. 14, 2008, the entire disclosure of which is incorporated herein by reference in its entirety.

BACKGROUND OF THE INVENTION

1. Field of the Invention

Some preferred embodiments of the present invention relate, inter alia, to a differential comparator configured to suppress stability deterioration, and an image A/D converter, especially a pipeline type A/D converter equipped with the differential comparator.

2. Description of the Related Art

The following description sets forth the inventor's knowledge of related art and problems therein and should not be construed as an admission of knowledge in the prior art.

In a conventional semiconductor integrated circuit, in cases where a DC input is continuously inputted into an A/D converter including a differential comparator for a long time, a phenomenon called "stability" occurs. In general, the stability is one of deterioration phenomena of MOS transistor characteristics. When a strong gate electric field generated at the gate oxide film of a MOS transistor is maintained for a long time or when the strong gate electric field is maintained in a dynamical manner, electric charges will be trapped by defects of the gate oxide film, resulting in temporal changes of the transistor characteristics, which in turn mainly causes changes of the threshold voltage Vt. This phenomenon is called "stability." Especially, the stability likely causes an offset in a differential circuit. For example, in a pipeline type A/D converter for performing A/D conversions using a differential circuit, a long time impression of a certain level of a DC voltage causes miscoding.

In a differential amplifier mounted in a pipeline A/D converter, the latch circuit for latching an output from the differential amplifier will hold the output of the same value for a long time when a DC voltage of a certain level is impressed from the analog input for a long time. This may cause stability deterioration of the MOS transistor forming the latch circuit.

As will be understood from the above, if a DC input is inputted into an A/D converter including a differential comparator for a long time, the DC stress of the inner latch circuit is fixed in one direction, which tends to cause stability deterioration. As a result, an offset occurs. When such offset occurs, accurate A/D conversions cannot be expected, resulting in malfunctions or causing various problems.

The description herein of advantages and disadvantages of various features, embodiments, methods, and apparatus disclosed in other publications is in no way intended to limit the present invention. For example, certain features of the preferred embodiments of the invention may be capable of overcoming certain disadvantages and/or providing certain advantages, such as, e.g., disadvantages and/or advantages discussed herein, while retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

Among other potential advantages, some embodiments can provide a differential comparator capable of bearing a DC stress for a long time.

Among other potential advantages, some embodiments can provide an A/D converter equipped with a differential comparator capable of bearing a DC stress for a long time.

Among other potential advantages, some embodiments can provide a method of suppressing stability deterioration of a switched latch circuit of a differential comparator.

According to a first aspect of some preferred embodiment of the present invention, a differential comparator comprises a differential amplifier configured to output differential output signals, a first switch portion configured to input the differential output signals from the differential amplifier and output the differential output signals from output terminals while changing over the output terminals, a latch portion configured to update and latch the differential output signals from the output terminals of the first switch portion, and a second switch portion configured to input output signals from the latch portion and output the latched output signals from output terminals while changing over the output terminals. Furthermore, the first switch portion and the second switch portion are changed over complementarily so that the differential output signals from the differential amplifier are always outputted from the same output terminals of the second switch portion respectively.

In the aforementioned differential comparator, for example, it can be configured as follows:

The first switch portion includes a first input terminal to which one of the differential output signals from the differential amplifier is inputted, a second input terminal to which the other differential output signal is inputted, a first output terminal, and a second output terminal, wherein the first input terminal and the first output terminal are connected via a first line equipped with a first analog switch and via a second line equipped with a second analog switch, and the second input terminal and the second output terminal are connected via a third line equipped with a third analog switch and via a fourth line equipped with a fourth analog switch. The latch portion includes a first latch circuit for latching an output signal from the first output terminal of the first switch portion, a second latch circuit for latching an output signal from the second output terminal of the first switch portion, and a switch, the first and second latch circuits being configured to change over data-updating and data-latching in accordance with ON-OFF control of the switch. The second switch portion includes a first multiplexer having a first output terminal, and a second multiplexer having a second output terminal, wherein one of output signals from the latch portion is inputted into a first input terminal of the first multiplexer and a first input terminal of the second multiplexer, and the other output signal from the latch portion is inputted into a second input terminal of the first multiplexer and a second input terminal of the second multiplexer. Furthermore, the first to fourth analog switches and the first and second multiplexers are changed over complementarily so that the differential output signals from the differential amplifier are always outputted from the same output terminals of the second switch portion respectively.

Furthermore, in the aforementioned differential comparator, for example, it can be configured as follows.

First switch portion includes a first multiplexer having a first output terminal, and a second multiplexer having a second output terminal, wherein one of outputs from the differential amplifier is inputted into a first input terminal of the first multiplexer and a first input terminal of the second multiplexer, and the other output is inputted into a second input terminal of the first multiplexer and a second input terminal of the second multiplexer. The latch portion includes a first latch circuit for latching one of output signals from the first multiplexer, a second latch circuit for latching the other output signal from the second multiplexer, and a switch, the first and second latch circuits being configured to switch over data-updating and data-latching in accordance with ON-OFF control of the switch. The second switch portion includes a third multiplexer having a first output terminal, and a fourth multiplexer having a second output terminal, wherein one of output signals from the latch portion is inputted into a first input of the third multiplexer and a first input of the fourth multiplexer, and the other output signal from the latch portion is inputted into a second input terminal of the third multiplexer and a second input terminal of the fourth multiplexer. Furthermore, the first and second multiplexers and the third and fourth multiplexers are changed over complementarily so that the differential output signals from the differential amplifier are always outputted from the same output terminals of the second switch portion respectively.

According to a second aspect of some preferred embodiment of the present invention, a pipeline type A/D converter is equipped with one of the aforementioned differential comparators.

In the aforementioned pipeline type A/D converter, for example, the differential comparator can be configured in the same manner as mentioned above.

According to a third aspect of some preferred embodiment of the present invention, a method of suppressing stability deterioration of a switched latch circuit of a differential comparator including a differential amplifier configured to output differential output signals, and a latch portion configured to update and latch the differential output signals and output latched output signals, comprises:

(1) providing a first switch portion configured to input the differential output signals from the differential amplifier and output the differential output signals from output terminals while changing over the output terminals;

(2) providing a second switch portion configured to input output signals from the latch portion and output the latched output signals output terminals while changing over the output terminals; and (3) changing over the first switch portion and the second switch portion complementarily so that the differential output signals from the differential amplifier are always outputted from the same output terminals of the second switch portion respectively.

According to the present invention, a differential comparator capable of bearing a DC stress for a long time can be provided. That is, even in cases where a DC input is continuously inputted for a long period of time, the switched latch portion provided in the differential comparator will not cause stability deterioration, resulting in less deterioration of characteristics, which in turn can extend the product lifetime. The present invention can be preferably applied to, for example, a pipeline type A/D converter having a differential comparator.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which.

DETAILED DESCRIPTION OF THE PREFERRED EMBODIMENTS

In the following paragraphs, some preferred embodiments of the invention will be described by way of example and not limitation. It should be understood based on this disclosure that various other modifications can be made by those in the art based on these illustrated embodiments.

Figure 1:
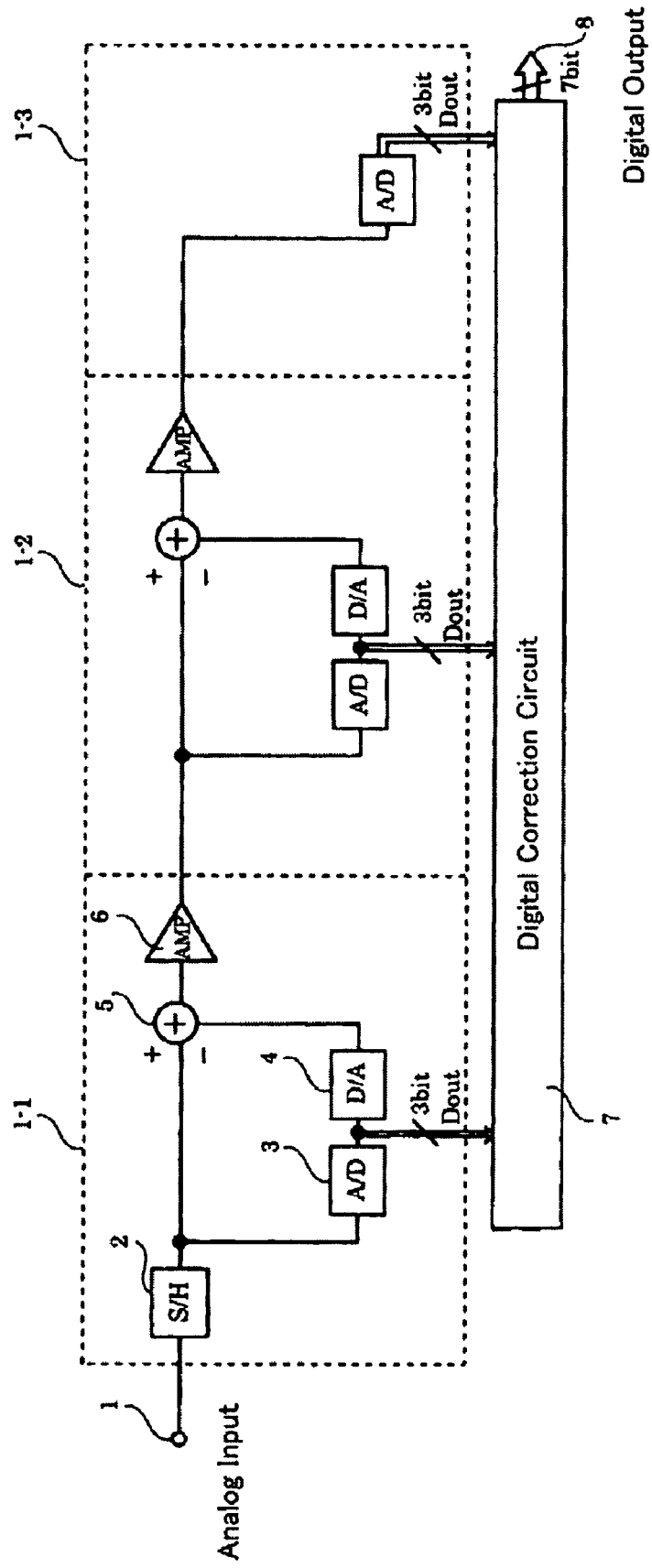
FIG. 1 is a circuit diagram of a general pipeline type A/D converter.

FIG. 1 shows a schematic circuit diagram of a 7-bit pipeline A/D converter generally used for converting visual image signals. The 7-bit pipeline A/D converter has a three-stage structure including a first conversion stage 1-1, a second conversion stage 1-2, and a third conversion stage 1-3. In the first stage 1-1, an analog signal is inputted from an analog input 1 into a sampling hold circuit 2. The upper three bits of seven bits of the signal is A/D converted by the A/D converter 3 and then D/A converted by the D/A converter 4. The 3-bit digital data digitally converted by the A/D converter 3 is outputted from the digital output Dout.

The three-bit digital data outputted from the digital output Dout is returned to an analog signal by the D/A converter 4. The differential signal of the difference between the input analog signal from the sampling hold circuit 2 and the analog signal converted by the D/A converter 4 is obtained by an subtracter 5. The differential signal outputted from the substracter 5 is amplified by a differential amplifier 6. The differential signal amplified by and outputted from the differential amplifier 6 is outputted to the second conversion stage 1-2. The second conversion stage 1-2 has the same structure as that of the first conversion stage 1-1. In the second conversion stage 1-2, the differential signal is further digitally converted in the same manner as in the first conversion stage 1-1.

Figure 2:
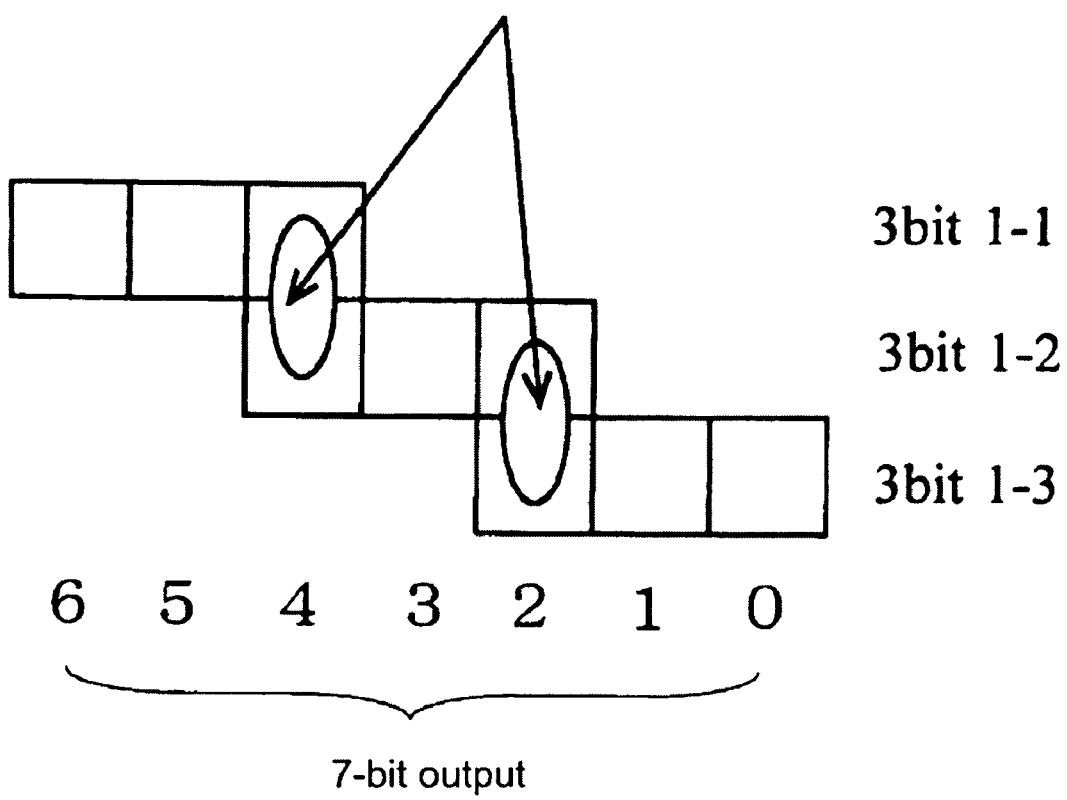
FIG. 2 shows a structure of a digital correction circuit of the A/D converter.

The differential signal from the second conversion stage 1-2 is digitally converted into a digital data. Since there is no fourth conversion stage, there is no need to obtain a differential signal. Therefore, the third conversion stage 1-3 is constituted only the an A/D converter 3. With the aforementioned structure, from each conversion stage, the 3-bit digital data is outputted to a digital correction circuit 7. In the digital correction circuit 7, as shown in FIG. 2, the first bit of the three-bit digital signal from the second conversion stage 1-2 and the last bit of the three-bit digital signal from the first conversion stage 1-1 are redundant, and the first bit of the three-bit digital signal from the third conversion stage 1-3 and the last bit of the three-bit digital signal from the second conversion stage 1-2 are redundant. As a result, the digital correction circuit 7 outputs a seven-bit digital data, which is less two-bit than nine-bit, from a digital output 8.

Figure 3:
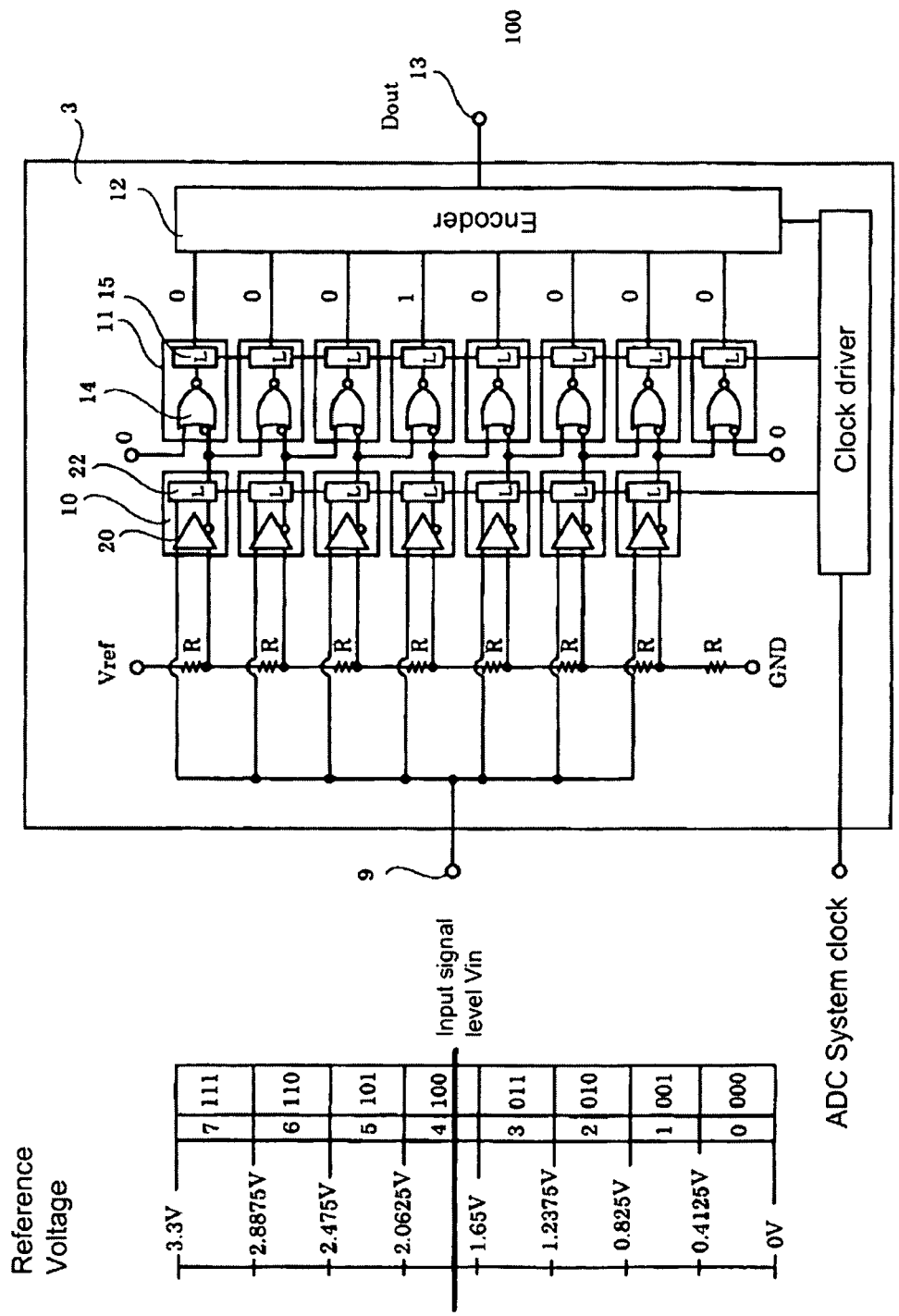
FIG. 3 is a circuit diagram of the A/D converter including a differential comparator according to the present invention.

FIG. 3 shows a circuit diagram of the A/D converter 3 shown in FIG. 1. In FIG. 3, the reference numeral "9" denotes an input terminal of the A/D converter 3. The A/D converter 3 includes a resistant ladder having eight resistances R equal in resistance value disposed between the reference voltage Vref and the ground voltage GND, so that seven staged voltages obtained by equally dividing the reference voltage into seven stages are outputted from the respective connecting portions of the resistances R. In this embodiment, the reference voltage is set to 3.3 V, and the reference voltage is equally divided into the seven staged reference voltages as shown in the left side of FIG. 3. The seven staged reference voltages and the input signal Vin inputted into the input terminal 9 are compared.

The input signal Vin inputted form the input terminal 9 is inputted into a total of seven differential comparators 10, and the seven staged reference voltages as comparison objects are also inputted to the respective differential comparators 10. Each comparator 10 compares the reference voltage and the input signal voltage. For example, if the input signal level is between 1.65 V and 2.0625 V as shown in FIG. 3, the upper three differential comparators 10 output "0," and the lower four differential comparators 10 output "1." Thus, the differential comparators 10 output "0001111" in turn from the above.

The respective outputs are inputted into a total of eight two-input NOR circuits 11 respectively. The two-input NOR circuit 11 is comprised of a two-input NOR element 14 and a latch circuit 15. In the two-input NOR element 14, the upper input is a non-inverted input and the lower input is an inverted input. Among the total of eight two-input NOR elements 14, "0" is inputted into the uppermost NOR element 14 and the lowermost NOR element 14. Furthermore, as shown in FIG. 3, the output of each of seven differential comparators 10 is inputted into the inverted input of each two-input NOR element 14 and the non-inverted input of one lower stage two-input NOR element 14, so that an output "1" can be outputted from the fourth two-input NOR circuit 11 from the above. Thus, the eight two-input NOR circuits 11 output "00010000" in this order from the above.

The outputs "00010000" from the eight two-input NOR circuits 11 are inputted into an encoder 12 and encoded into three-bit data to be outputted as "100" from the output terminal 13. The binary number "100" corresponds to a decimal number "4." Thus, the input signal has been digitally converted into a three-bit digital data. There is a difference between the converted three-bit digital data and the inputted analog signal. The difference will be further digitally converted as a differential signal at the second conversion stage 1-2 and thereafter.

At this time, an A/D converter system clock is supplied to the differential comparators 10, the two-input NOR circuits 11 and the encoder 12. The A/D converter 3 has latch circuits configured to be operated upon receipt of the clock and is operated synchronously.

Figure 4:
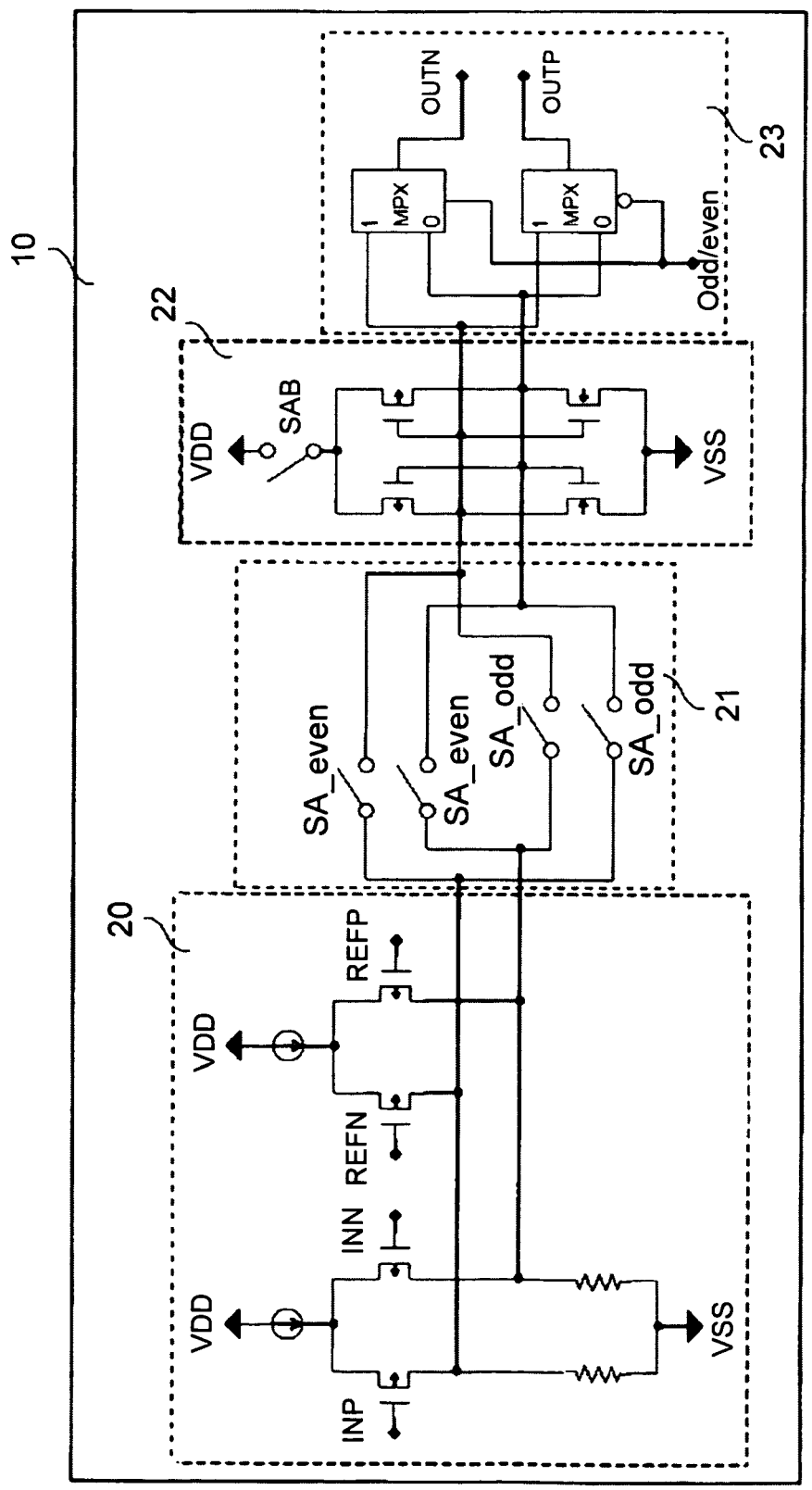
FIG. 4 is a circuit diagram of the differential comparator according to a first embodiment of the present invention.

FIG. 4 shows the inner structure of the differential comparator 10. The differential comparator 10 includes a differential amplifier 20, a first change-over switch portion 21, a latch portion 22, and a second change-over switch portion 23.

The differential amplifier 20 has a differential input plus terminal INP to which the input signal is inputted, a differential input minus terminal INN to which the seven staged reference voltage shown in FIG. 3 is inputted, a plus reference terminal REFP to which a reference voltage is inputted, and a minus reference terminal REFN to which a ground voltage GND is inputted. Thus, the input signal is amplified, so that the minute analog signal becomes a digital level capable of being judged as "H" or "L" level. The differential outputs are inputted into the first change-over switch portion 21.

In the first change-over switch portion 21, the differential outputs (plus side and minus side) outputted from the differential amplifier 20 are separated into two outputs respectively, i.e., a total of four outputs. Thus, the switch portion 21 has a total of four divided lines each having an analog switch so that two plus side differential outputs and two minus side differential outputs are outputted from the first change-over switch portion 21.

Figure 5:
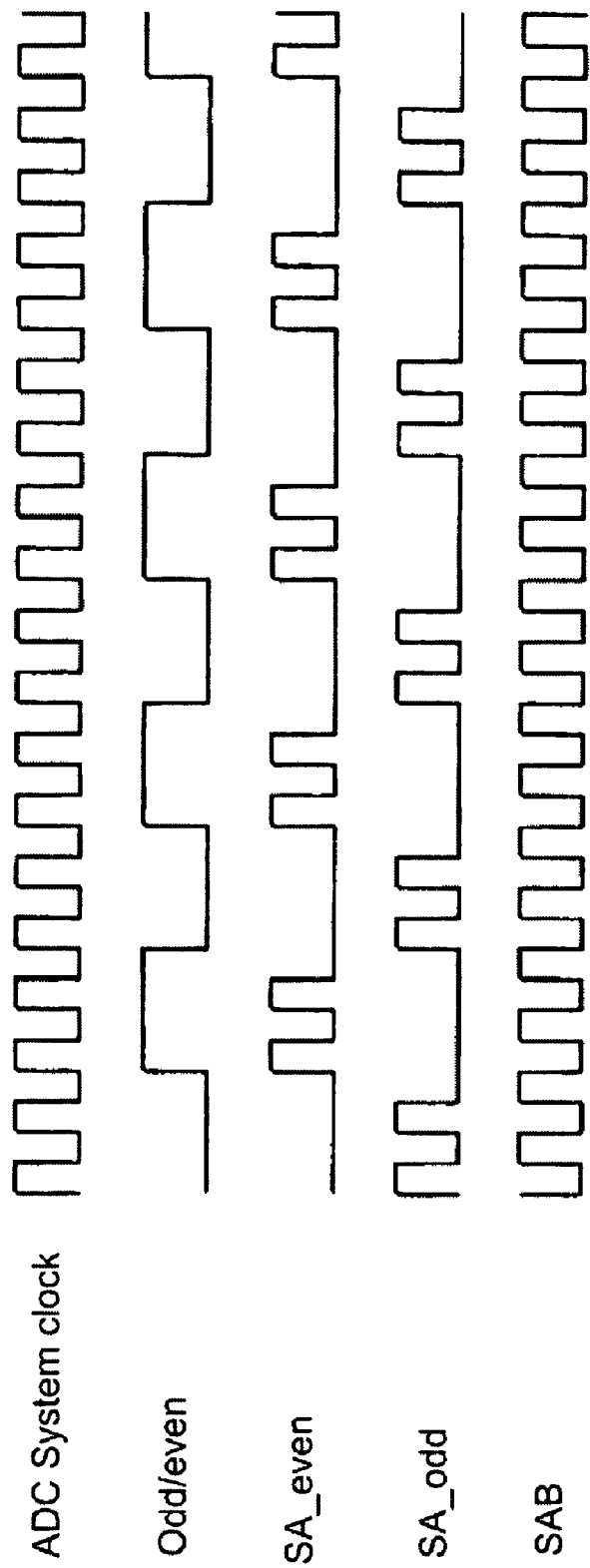
FIG. 5 is a timing chart of control signals for controlling the differential circuit.

In detail, the two analog switches for the divided plus side differential outputs are on-off controlled by SA_even and SA_odd signals. The timings of the SA_even and SA_odd signals are shown in FIG. 5. These SA_even and SA_odd signals are created based on an ADC system clock and odd/even signals. That is, the ADC system clock, which is a system clock, is frequency divided into odd/even signals. FIG. 5 shows one concrete example of an odd/even signal created by frequency dividing the ADC system clock by four. The odd/even signal repeats "H" and "L" at equal intervals.

As mentioned above, the SA_even and SA_od signals are created based on the ADC system clock and the odd/even signal. The SA_even signal can be obtained by performing a logic operation AND of the ADC system clock and the odd/even signal. On the other hand, the SA_odd signal can be obtained by performing a logic operation AND of the ADC system clock and the reversed odd/even signal.

The analog switch to be controlled by the SA_even signal or the SA_odd signal is turned ON when the SA_even signal or the SA_odd signal is in an "H" state, and becomes turned OFF when in an "L" state. As shown in FIG. 5, since the SA_even and the SA_odd signals become complementarily turned ON and OFFF, the differential outputs from the differential amplifier 20 will be periodically changed over and outputted from the two output terminals. The outputs from the first change-over switch portion 21 are inputted into the latch portion 22 with a switch function (i.e., a switched latch circuit).

The latch portion 22 with a switch function is configured to update data during the "H" state of the SAB signal and hold the data during the "L" state of the SAB. The SAB signal shown in FIG. 5 is an inversion signal of the system clock of the A/D converter. The data is updated at the rising timing of the "H" state of the system clock of the A/D converter and immediately returned to the "L" state. Thus, the latch portion 22 holds the updated data. With this, the latch portion 22 with a switch function performs the data updating and latching in synchronization with the system clock of the A/D converter. The outputs of the latch portion 22 with a switch function will be outputted to the second change-over switch portion 23.

The second change-over switch portion 23 includes a total of two 2-input, 1-output multiplexer. Each output from the latch portion 22 with a switch function is divided into two signals and inputted into separate multiplexers. The selection control signal for the multiplexer is controlled using the odd/even signals as shown in FIG. 5. When the odd/even signal is in an "H" state, the upper multiplexer allows passing of the input signal from the terminal "1." On the other hand, the odd/even signal is in an "L" state, the upper multiplexer stops the input from the terminal "0" and allows passing of the input signal from the terminal "0." The lower multiplexer performs an operation opposite to the operation of the upper multiplexer since the input signal is inversed when odd/even control signal is inputted. The odd/even signal periodically repeats the "H" state and the "L" state, and therefore the output signals from the latch portion 22 with a switch function will be outputted alternatively from the upper and lower multiplexers.

With the aforementioned structure, the differential outputs from the differential amplifier 20 will be changed over in the plus side and the minus side and pass through the second change-over switch 21, and then will be again changed over in the plus side and the minus side to be returned to the original state. In other words, if the differential signals are not changed over at the first change-over switch portion 21, the signals will not be changed over at the second change-over switch portion 23 and outputted as it is. As a result, although the passages of the latch portion 22 are changed over alternatively, the outputs to be finally outputted from the second change-over switch portion 23 will not be changed over.

The aforementioned switching over is caused by the complementary operations of the SA_even signal, the SA_odd signal, and the even/odd signal, which are control signals for controlling the first and second change-over switch portions 21 and 22.

With the aforementioned structure, even if a DC input is applied to the A/D converter 3 having a differential comparator structure, the DC stress of the latch portion 22 with a switch function will not be fixed in one direction. This solves the problem that DC stress fixed in one direction causes stability deterioration and offset.

Figure 6:
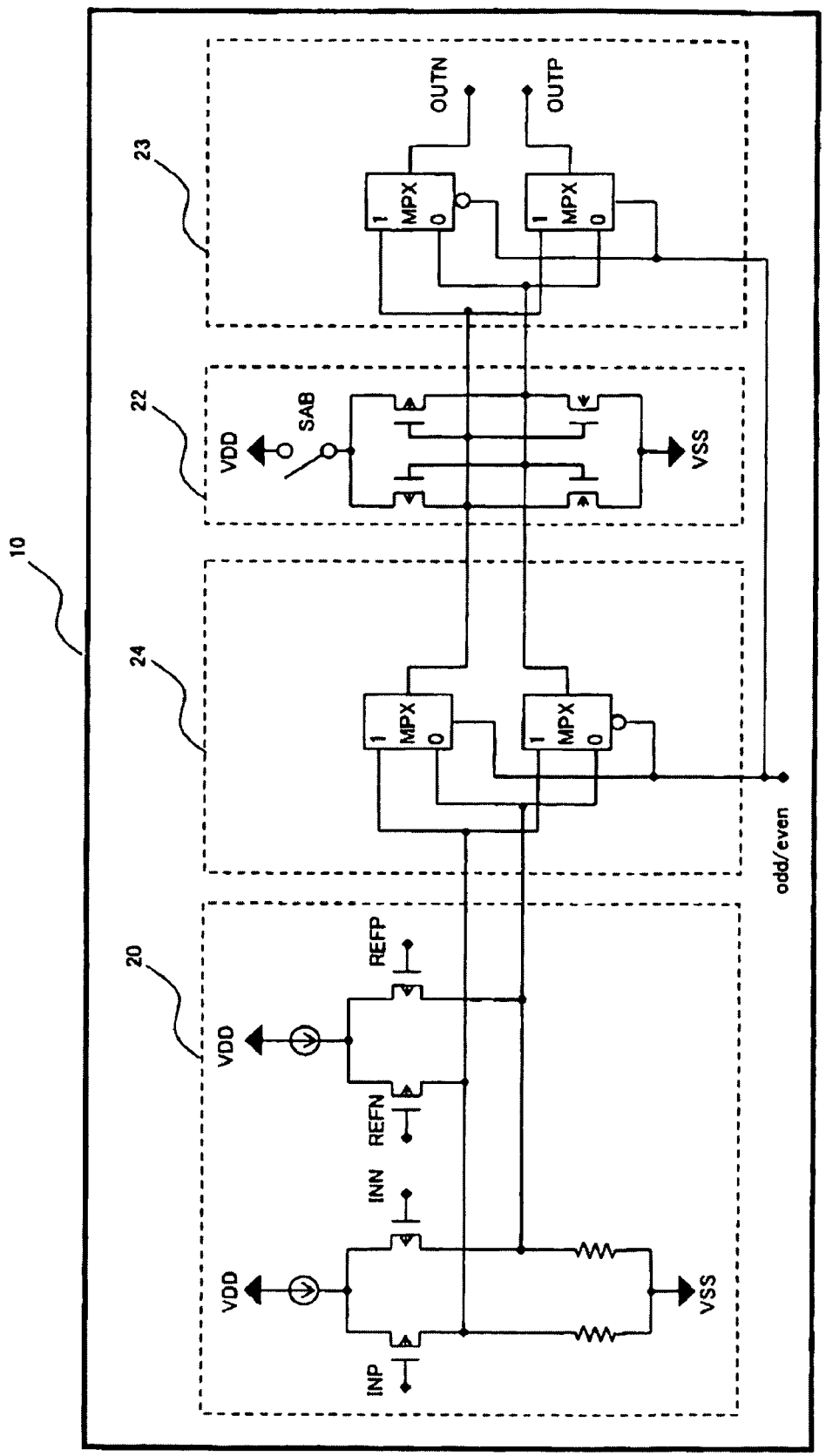
FIG. 6 is a circuit diagram of a differential comparator according to a second embodiment of the present invention.

In the embodiment shown in FIG. 4, the first change-over switch portion 21 is comprised of analog switches. In the present invention, however, the first change-over switch portion 21 can be comprised of multiplexers. FIG. 6 shows an embodiment in which the first change-over switch portion 24 is comprised of multiplexers MPX in place of analog switches. Also in this embodiment, the signal passages can be changed over periodically so as not to cause stability deterioration, resulting in the same effect as in the first embodiment shown in FIG. 4.

Although the aforementioned embodiments employ multiplexers in the second change-over switch portion 23, it should be noted that the present invention allows the use of analog switches in the second change-over switch portion 23 though the concrete structure is not illustrated.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" is meant as a non-specific, general reference and may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. A differential comparator, comprising:
   a differential amplifier configured to output differential output signals;
   a first switch portion configured to input the differential output signals from the differential amplifier and output the differential output signals from output terminals while changing over the output terminals;
   a latch portion configured to update and latch the differential output signals from the output terminals of the first switch portion; and
   a second switch portion configured to input output signals from the latch portion and output the latched output signals from output terminals while changing over the output terminals,
   wherein the first switch portion and the second switch portion are changed over complementarily so that the differential output signals from the differential amplifier are always outputted from the same output terminals of the second switch portion respectively.

2. The differential comparator as recited in claim 1, wherein the first switch portion includes a first input terminal to which one of the differential output signals from the differential amplifier is inputted, a second input terminal to which the other differential output signal is inputted, a first output terminal, and a second output terminal, wherein the first input terminal and the first output terminal are connected via a first line equipped with a first analog switch and via a second line equipped with a second analog switch, and wherein the second input terminal and the second output terminal are connected via a third line equipped with a third analog switch and via a fourth line equipped with a fourth analog switch,
   wherein the latch portion includes a first latch circuit for latching an output signal from the first output terminal of the first switch portion, a second latch circuit for latching an output signal from the second output terminal of the first switch portion, and a switch, the first and second latch circuits being configured to change over data-updating and data-latching in accordance with ON-OFF control of the switch,
   wherein the second switch portion includes a first multiplexer having a first output terminal, and a second multiplexer having a second output terminal, wherein one of output signals from the latch portion is inputted into a first input terminal of the first multiplexer and a first input terminal of the second multiplexer, and the other output signal from the latch portion is inputted into a second input terminal of the first multiplexer and a second input terminal of the second multiplexer, and wherein the first to fourth analog switches and the first and second multiplexers are changed over complementarily so that the differential output signals from the differential amplifier are always outputted from the same output terminals of the second switch portion respectively.

3. The differential comparator as recited in claim 1, wherein the first switch portion includes a first multiplexer having a first output terminal, and a second multiplexer having a second output terminal, wherein one of outputs from the differential amplifier is inputted into a first input terminal of the first multiplexer and a first input terminal of the second multiplexer, and the other output is inputted into a second input terminal of the first multiplexer and a second input terminal of the second multiplexer, wherein the latch portion includes a first latch circuit for latching one of output signals from the first multiplexer, a second latch circuit for latching the other output signal from the second multiplexer, and a switch, the first and second latch circuits being configured to switch over data-updating and data-latching in accordance with ON-OFF control of the switch, wherein the second switch portion includes a third multiplexer having a first output terminal, and a fourth multiplexer having a second output terminal, wherein one of output signals from the latch portion is inputted into a first input of the third multiplexer and a first input of the fourth multiplexer, and the other output signal from the latch portion is inputted into a second input terminal of the third multiplexer and a second input terminal of the fourth multiplexer, and wherein the first and second multiplexers and the third and fourth multiplexers are changed over complementarily so that the differential output signals from the differential amplifier are always outputted from the same output terminals of the second switch portion respectively.

4. A pipeline type A/D converter equipped with a differential comparator, wherein the differential comparator comprises:

a differential amplifier configured to output differential output signals;

a first switch portion configured to input the differential output signals from the differential amplifier and output the differential output signals from output terminals while changing over the output terminals;

a latch portion configured to update and latch the differential output signals from the output terminals of the first switch portion; and a second switch portion configured to input output signals from the latch portion and output the latched output signals, wherein the first switch portion and the second switch portion are changed over complementarily so that the differential output signals from the differential amplifier are always outputted from the same output terminals of the second switch portion respectively.

5. The pipeline type A/D converter as recited in claim 4, wherein the first switch portion includes a first input terminal to which one of the differential output signals from the differential amplifier is inputted, a second input terminal to which the other differential output signal is inputted, a first output terminal, and a second output terminal, wherein the first input terminal and the first output terminal are connected via a first line equipped with a first analog switch and via a second line equipped with a second analog switch, and wherein the second input terminal and the second output terminal are connected via a third line equipped with a third analog switch and via a fourth line equipped with a fourth analog switch, wherein the latch portion includes a first latch circuit for latching an output signal from the first output terminal of the first switch portion, a second latch circuit for latching an output signal from the second output terminal of the first switch portion, and a switch, the first and second latch circuits being configured to change over data-updating and data-latching in accordance with ON-OFF control of the switch, wherein the second switch portion includes a first multiplexer having a first output terminal, and a second multiplexer having a second output terminal, wherein one of output signals from the latch portion is inputted into a first input terminal of the first multiplexer and a first input terminal of the second multiplexer, and the other output signal from the latch portion is inputted into a second input terminal of the first multiplexer and a second input terminal of the second multiplexer, and wherein the first to fourth analog switches and the first and second multiplexers are changed over complementarily so that the differential output signals from the differential amplifier are always outputted from the same output terminals of the second switch portion respectively.

6. The pipeline type A/D converter as recited in claim 4, wherein the first switch portion includes a first multiplexer having a first output terminal, and a second multiplexer having a second output terminal, wherein one of outputs from the differential amplifier is inputted into a first input terminal of the first multiplexer and a first input terminal of the second multiplexer, and the other output is inputted into a second input terminal of the first multiplexer and a second input terminal of the second multiplexer, wherein the latch portion includes a first latch circuit for latching one of output signals from the first multiplexer, a second latch circuit for latching the other output signal from the second multiplexer, and a switch, the first and second latch circuits being configured to switch over data-updating and data-latching in accordance with ON-OFF control of the switch, wherein the second switch portion includes a third multiplexer having a first output terminal, and a fourth multiplexer having a second output terminal, wherein one of output signals from the latch portion is inputted into a first input of the third multiplexer and a first input of the fourth multiplexer, and the other output signal from the latch portion is inputted into a second input terminal of the third multiplexer and a second input terminal of the fourth multiplexer, and wherein the first and second multiplexers and the third and fourth multiplexers are changed over complementarily so that the differential output signals from the differential amplifier are always outputted from the same output terminals of the second switch portion respectively.

7. A method of suppressing stability deterioration of a switched latch circuit of a differential comparator, wherein the differential comparator includes a differential amplifier configured to output differential output signals, and a latch portion configured to update and latch the differential output signals and output latched output signals, the method comprising:
providing a first switch portion configured to input the differential output signals from the differential amplifier and output the differential output signals from output terminals while changing over the output terminals;
providing a second switch portion configured to input output signals from the latch portion and output the latched output signals output terminals while changing over the output terminals; and
changing over the first switch portion and the second switch portion complementarily so that the differential output signals from the differential amplifier are always outputted from the same output terminals of the second switch portion respectively.

8. The method as recited in claim 7,
wherein the first switch portion includes a first input terminal to which one of the differential output signals from the differential amplifier is inputted, a second input terminal to which the other differential output signal is inputted, a first output terminal, and a second output terminal, wherein the first input terminal and the first output terminal are connected via a first line equipped with a first analog switch and via a second line equipped with a second analog switch, and wherein the second input terminal and the second output terminal are connected via a third line equipped with a third analog switch and via a fourth line equipped with a fourth analog switch,
wherein the second switch portion includes a first multiplexer having a first output terminal, and a second multiplexer having a second output terminal, wherein one of output signals from the latch portion is inputted into a first input terminal of the first multiplexer and a first input terminal of the second multiplexer, and the other output signal from the latch portion is inputted into a second input terminal of the first multiplexer and a second input terminal of the second multiplexer, and
wherein the first to fourth analog switches and the first and second multiplexers are changed over complementarily so that the differential output signals from the differential amplifier are always outputted from the same output terminals of the second switch portion respectively.

9. The method as recited in claim 7,
wherein the first switch portion includes a first multiplexer having a first output terminal, and a second multiplexer having a second output terminal, wherein one of outputs from the differential amplifier is inputted into a first input terminal of the first multiplexer and a first input terminal of the second multiplexer, and the other output is inputted into a second input terminal of the first multiplexer and a second input terminal of the second multiplexer,
wherein the second switch portion includes a third multiplexer having a first output terminal, and a fourth multiplexer having a second output terminal, wherein one of output signals from the latch portion is inputted into a first input of the third multiplexer and a first input of the fourth multiplexer, and the other output signal from the latch portion is inputted into a second input terminal of the third multiplexer and a second input terminal of the fourth multiplexer, and
wherein the first and second multiplexers and the third and fourth multiplexers are changed over complementarily so that the differential output signals from the differential amplifier are always outputted from the same output terminals of the second switch portion respectively.

* * * * *